US010224404B2

United States Patent
Akiyama et al.

(10) Patent No.: US 10,224,404 B2
(45) Date of Patent: Mar. 5, 2019

(54) INSULATED GATE TURN-OFF DEVICE WITH HOLE INJECTOR FOR FASTER TURN OFF

(71) Applicant: Pakal Technologies, LLC, San Francisco, CA (US)

(72) Inventors: Hidenori Akiyama, Miyagi (JP); Vladimir Rodov, Seattle, WA (US); Richard A. Blanchard, Los Altos, CA (US); Woytek Tworzydlo, Austin, TX (US)

(73) Assignee: Pakal Technologies, Inc., San Francisco, CA (US)

( * ) Notice: Subject to any disclaimer, the term of this patent is extended or adjusted under 35 U.S.C. 154(b) by 0 days.

(21) Appl. No.: 15/632,169

(22) Filed: Jun. 23, 2017

(65) Prior Publication Data

US 2018/0006120 A1    Jan. 4, 2018

Related U.S. Application Data

(60) Provisional application No. 62/356,169, filed on Jun. 29, 2016.

(51) Int. Cl.
| | |
|---|---|
| *H01L 29/10* | (2006.01) |
| *H01L 29/417* | (2006.01) |
| *H01L 29/745* | (2006.01) |
| *H01L 29/739* | (2006.01) |
| *H01L 29/06* | (2006.01) |
| *H01L 29/08* | (2006.01) |

(52) U.S. Cl.
CPC ...... *H01L 29/1095* (2013.01); *H01L 29/0696* (2013.01); *H01L 29/0839* (2013.01); *H01L 29/4175* (2013.01); *H01L 29/7395* (2013.01); *H01L 29/7455* (2013.01)

(58) Field of Classification Search
CPC .................... H01L 29/1095; H01L 29/0696
See application file for complete search history.

(56) References Cited

U.S. PATENT DOCUMENTS 7,737,491 B2 * 6/2010 Hotta ................. H01L 29/0619
257/330

* cited by examiner

*Primary Examiner* — Trang Q Tran
(74) *Attorney, Agent, or Firm* — Patent Law Group LLP; Brian D. Ogonowsky

(57) ABSTRACT

An insulated gate turn-off (IGTO) device, formed as a die, has a layered structure including a p+ layer (e.g., a substrate), an n− epi layer, a p-well, vertical insulated gate electrodes formed in the p-well, and n+ regions between the gate electrodes, so that vertical npn and pnp transistors are formed. The device is formed of a matrix of cells. To turn the device on, a positive voltage is applied to the gate electrodes, referenced to the cathode. To speed up the removal of residual electrons in the p-well after the gate electrode voltage is removed, a p+ region is added adjacent the n+ regions, and an n-layer is added below the p+ region. The cathode electrode directly contacts the p+ region and the n+ regions. During turn-off, the p+ region provides holes which recombine with the residual electrons to rapidly terminate the current flow.

11 Claims, 4 Drawing Sheets

INSULATED GATE TURN-OFF DEVICE WITH HOLE INJECTOR FOR FASTER TURN OFF

CROSS-REFERENCE TO RELATED APPLICATIONS

This application is based on provisional application Ser. No. 62/356,169, filed Jun. 29, 2016, by Hidenori Akiyama, assigned to the present assignee and incorporated herein by reference.

FIELD OF THE INVENTION

This invention relates to insulated gate turn-off (IGTO) devices and, more particularly, to an IGTO device design that includes an improved turn-off feature.

BACKGROUND

Prior art FIG. 1 is a cross-section of a small portion of an IGTO device 10 (similar in some respects to a thyristor) reproduced from the assignee's U.S. Pat. No. 8,878,237, incorporated herein by reference. The portion is near an edge of the device and shows a plurality of cells having vertical gate electrodes 12 (e.g., doped polysilicon) formed in insulated trenches. A 2-dimensional array of the cells may be formed in a common, lightly-doped p-well 14, and the cells are connected in parallel. The edge of the device suffers from field crowding, and the edge cell is modified to increase ruggedness of the device. The edge cell has an opening 16 in the n+ region 18 where the cathode electrode 20 "weakly" shorts the various n+ regions 18 in the p-well 14 to the p-well 14. Such shorting increases the tolerance to transients to prevent unwanted turn on and prevents the formation of hot spots.

FIG. 2 is a top down view of only three of the cells, showing only the top semiconductor surface. FIG. 3 is an equivalent circuit. The n+ regions 18 may be formed by implantation or by other known dopant introduction methods.

The vertical gate electrodes 12 are insulated from the p-well 14 by an oxide layer 22. A p+ contact 24 region (FIG. 2) may be used at the opening 16 of the edge cell for improved electric contact to the p-well 14. The narrow gate electrodes 12 are connected together outside the plane of the drawing and are coupled to a gate voltage via the gate metal 25 directly contacting the polysilicon portion 28. A patterned dielectric layer 26 insulates the metal 25 from the various regions. The guard rings 29 at the edge of the cell, and at the edge of the die, reduce field crowding for increasing the breakdown voltage.

An npnp semiconductor layered structure is formed. There is a bipolar pnp transistor 31 (FIG. 3) formed by a p+ substrate 30, an n− epitaxial (epi) layer 32, and the p− well 14. There is also a bipolar npn transistor 34 (FIG. 3) formed by the n-epi layer 32, the p-well 14, and the n+ region 18. An n-type buffer layer 35, with a dopant concentration higher than that of the n− epi layer 32, reduces the injection of holes into the n− epi layer 32 from the p+ substrate 30 when the device is conducting. A bottom anode electrode 36 contacts the substrate 30, and a cathode electrode 20 contacts the n+ region 18. The p-well 14 surrounds the gate structure, and the n− epi layer 32 extends to the surface around the p-well 14.

When the anode electrode 36 is forward biased with respect to the cathode electrode 20, but without a sufficiently positive gate bias, there is no current flow, since there is a reverse biased vertical pn junction and the product of the betas (gains) of the pnp and npn transistors is less than one (i.e., there is no regeneration activity).

When the gate is forward biased, electrons from the n+ region 18 become the majority carriers along the gate sidewalls and below the bottom of the trenches in an inversion layer, causing the effective width of the npn base (the portion of the p-well 14 between the n-layers) to be reduced. As a result, the beta of the npn transistor increases to cause the product of the betas to exceed one. This results in "breakover," when holes are injected into the lightly doped n− epi layer 32 and electrons are injected into the p-well 14 to fully turn on the device. Accordingly, the gate bias initiates the turn-on, and the full turn-on (due to regenerative action) occurs when there is current flow through the npn transistor 34 as well as current flow through the pnp transistor 31.

When the gate bias is taken to zero, such as the gate metal 25 being shorted to the cathode electrode 20, or taken negative, the IGTO device turns off since the effective base width of the npn transistor is increased.

With reference to the equivalent circuit of FIG. 3, when the device is biased on with a sufficiently positive gate voltage, an inversion layer (electrons) is created in the p-well along the gate, creating the narrow-base transistor 34 (the effective width of the p-well base is reduced) having a relatively high gain to turn the device on. When the gate voltage is below the threshold (e.g., at 0 volts), the npn base width is relatively large, resulting in low beta, and the device is off. This off-state is represented by the wide-base transistor 42. The conductivity of the MOSFET 43, formed by the n+ region 18, the p-well 14, the n-epi layer 32, and the gate electrode 12, determines whether the narrow-base or wide-base npn transistor conducts. The JFET 44 represents the enablement or disablement of the wide-base transistor 42 in response to the gate voltage and can be deleted for a simplified equivalent diagram. The JFET 44 is considered on when the MOSFET 43 is off and considered off when the MOSFET 43 is on.

The device is intended to be a high current device that has a fast turn-on and a fast turn-off, such as for precision motor control or high frequency control applications. When the device of FIG. 1 is controlled to turn off, the "residual" electrons in the p-well 14 need to quickly recombine or otherwise be removed for current flow to cease. By increasing the speed of recombination or removal of the electrons, an improvement in turn-off time will result. The device of FIG. 1 ultimately achieves full turn-off, but there is a need to accelerate the turn-off speed in certain applications.

Accordingly, what is needed is an improvement to an IGTO device, such as the device of FIG. 1, where the current flow is terminated more rapidly after the gate voltage is removed.

SUMMARY

An IGTO device having vertical gate electrodes has a plurality of cells connected in parallel. Various epitaxial layers form npnp layers that create vertical bipolar npn and pnp transistors. Each cell generally includes a top n+ region, a p-well between and below opposing vertical gate electrodes, an n− epi layer below the p-well, and a p+ substrate to form the npnp layers. A positive voltage is applied to the p+ substrate (the anode), and a more negative voltage (e.g., ground) is applied to the n+ region (the cathode). A sufficiently positive gate voltage reduces the base width of the npn transistor to increase its gain, turning on the device (due to regeneration) to cause a current to flow between the anode and cathode. Removing the gate electrode voltage (such as shorting the gate metal to the cathode), or making the gate metal voltage negative, turns the device off.

When the gate voltage is removed, while a sufficiently high current is being conducted, "residual" electrons remaining in the p-well need to be rapidly removed to stop the flow of current.

One way to improve turn-off behavior is to introduce defects in the silicon by irradiating it with electrons or other particles. Alternatively, introducing certain metals such as gold or platinum also decreases carrier lifetime. Such techniques add significant time and cost to the fabrication process. The present invention involves the use of a different technique to improve device turn-off without a significant increase in cost.

To accelerate the removal of electrons from the p-well, such as the p-well in FIG. 1, an n-type layer is added below, and in contact with, the n+ regions, and a surface p+ region is formed extending between the top cathode metal and the added n-type layer. The cathode metal directly contacts the n+ region and the added p+ region. The gate extends below the added n-type layer and terminates within the p-well. The added n-type layer has a relatively low dopant concentration but does not adversely affect on-resistance since, when the device is in its on state, the gate effect creates a high density of electrons along its length, forming a highly conductive vertical path between the n+ regions and the bottom portion of the p-well. The n-type layer acts as an emitter for the vertical npn transistor, while the n+ regions achieve good electrical contact between the n-type layer and the cathode metal.

When the IGTO device's gate electrode voltage is taken to a voltage below its threshold voltage, the device begins to turn off. The holes in the surface p+ region are available to recombine with any remaining conduction electrons. The location of the reservoir of holes near the main conduction path of the IGTO device means that current flow ceases sooner than in the prior art device of FIG. 1 and similar devices. The added n-type layer and p+ region may be between each trenched gate electrode in the array of cells to maximize turn-off speed. Since the added p+ region may slightly reduce the npn transistor efficiency due to a reduced n+ region area, the gate-to-gate spacing may be increased to increase the n+ region area to account for the p+ regions. In an alternative embodiment, the p+ regions may not be provided between all the gate electrodes but evenly distributed throughout the cell array, such as provided in every other cell.

In another embodiment, there may be two or more distributed p+ regions between the n+ regions extending between the cathode metal and the added n-type layer.

Another embodiment is described below.

Assuming that the cathode metal is coupled to ground (zero volts) when the gate electrode voltage is reduced to a voltage below the threshold voltage of the IGTO device, conduction electrons in the p-well need to recombine or to otherwise be removed from this area. A cell of the second embodiment contains at least two adjacent n+ regions. The lightly doped n-type regions are only formed around each n+ region, and no p+ regions are formed. Adjacent n-type regions intersect, but the dopant concentration in this overlapping area is lower than that of the n-type region adjacent to the n+ region. This lower n-type dopant concentration results in a lower conduction electron concentration. This lower conduction electron concentration, in turn, results in a higher equilibrium hole concentration, with these additional holes being available to reduce the turn-off time of the device.

The invention is applicable to other types of vertical IGTO devices that use a vertical gate electrode to control the conduction of vertical bipolar transistors.

BRIEF DESCRIPTION OF THE DRAWINGS

Elements that are the same or equivalent are labelled with the same numerals.

DETAILED DESCRIPTION

Figure 1:
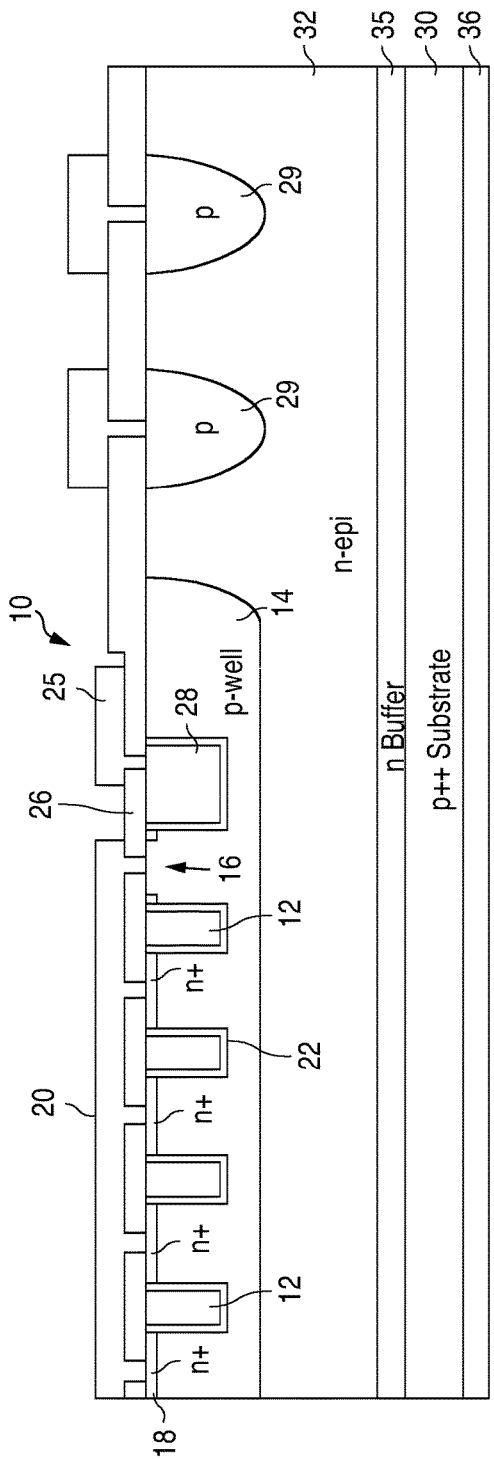
FIG. 1 is a cross-sectional view of an edge portion of the assignee's prior art IGTO device.
Figure 3:
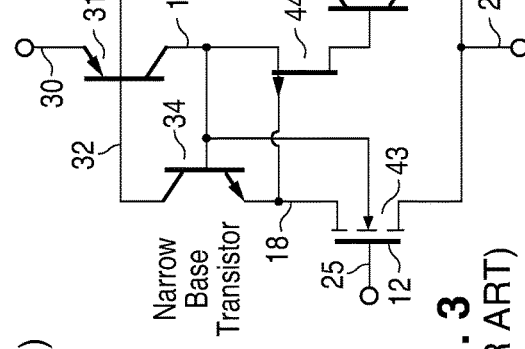
FIG. 3 is a simplified equivalent circuit of the device of FIG. 1 for the on and off states.
Figure 2:
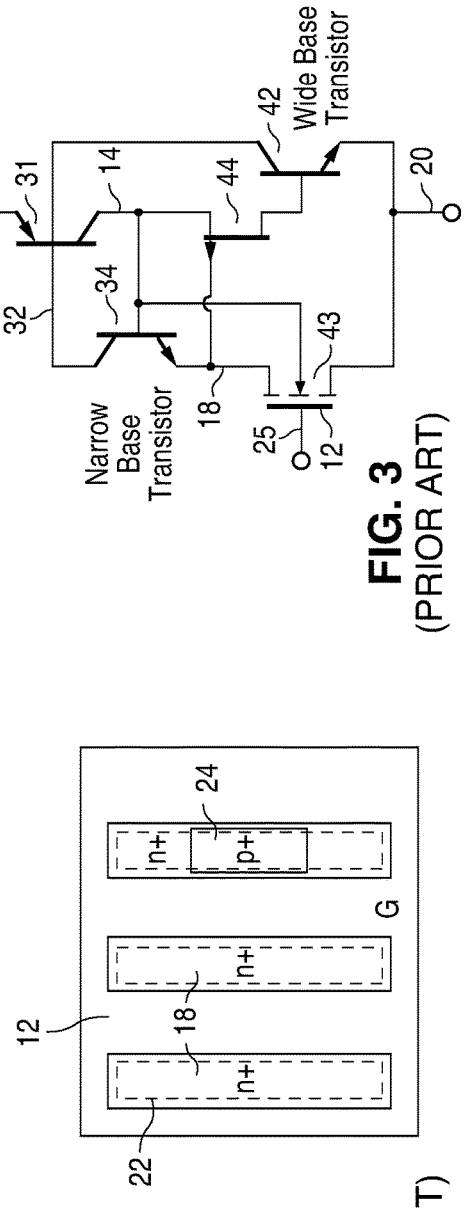
FIG. 2 is a top down view of three cells in the device of FIG. 1 at the surface of the semiconductor regions.

In one embodiment, the improvement is made to the prior art device shown in FIG. 1; however, the improvement is applicable to all gate turn-off (IGTO) devices that bias a vertical gate electrode to begin a vertical bipolar transistor action. Such devices have a lower on-voltage at high currents compared to vertical MOSFETs. Thus, the invention is applicable to types of IGBTs, gated thyristors, and other related devices.

Figure 4:
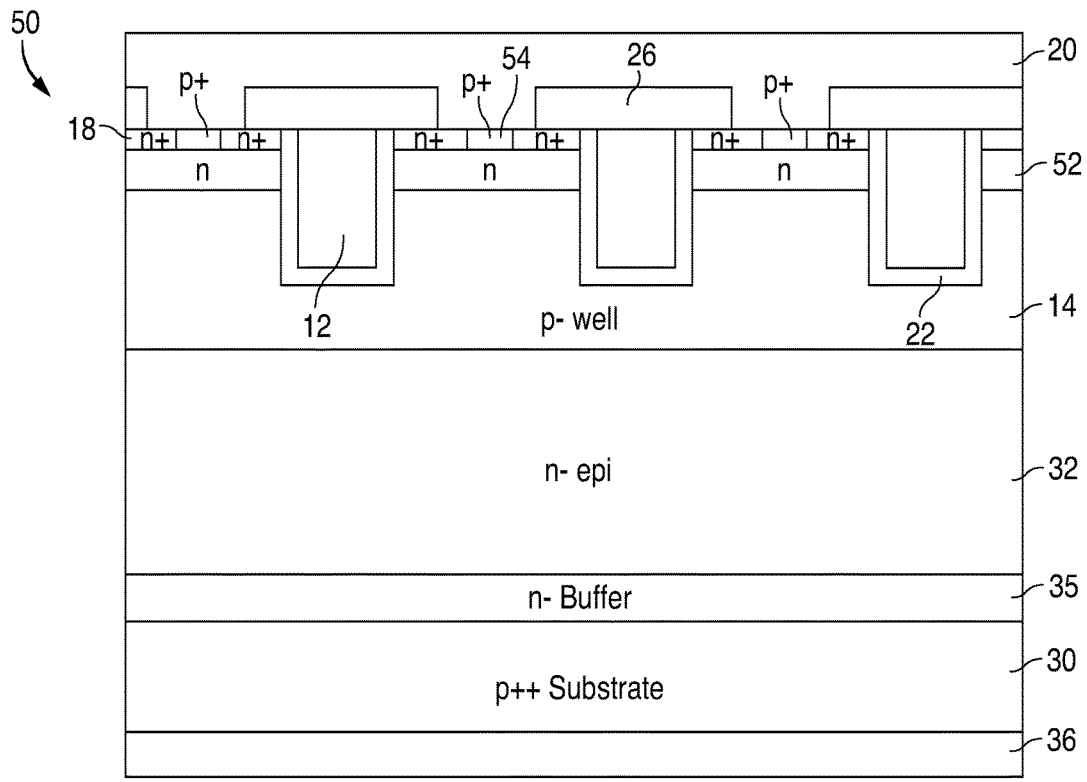
FIG. 4 is a cross-sectional view of three cells, in accordance with one embodiment of the invention, that may replace the cells in the device of FIG. 1, where the improved cells enable the device to be more quickly turned off. An n-type layer and p+ region is added to each cell of the device of FIG. 1.

FIG. 4 is a cross-sectional view of three cells of an IGTO device 50, formed as a single die, in accordance with one embodiment of the invention. The cells may replace the cells of the device shown in FIG. 1. The devices of FIGS. 1 and 4 operate in generally the same way, so the explanation of the general operation is abbreviated. The elements of FIGS. 1 and 4 that may be similar are labeled with the same numerals, and these common elements were previously described with respect to FIG. 1. The cells may be formed as parallel strips or in any other shape, including square, hexagons, etc. The corresponding regions and gates in the various cells are connected in parallel for conducting a high current.

Assuming a positive voltage is applied to the anode electrode 36 and a more negative voltage is applied to the cathode electrode 20, the IGTO device 50 is an open circuit when the gate electrode 12 is shorted to the cathode electrode 20 or made more negative. This is because there is a reversed biased pn junction in the various layers, and the product of the gains of the vertical npn and pnp bipolar transistors is less than one, so there is no regenerative action.

When a positive voltage above a threshold voltage is applied to the gate electrodes 12, via a surface gate metal (not shown in FIG. 4 but may be similar to gate metal 25 in FIG. 1), electrons accumulate around the gate electrodes 12 to form an inversion layer in the p-well 14. This effectively reduces the width of the npn transistor base to increase its gain. The product of the gains of the npn and pnp transistors is now greater than one, and regenerative action occurs to turn the device fully on. Holes are injected by the p+ substrate 30, and electrons are injected by the n+ regions 18 (emitters of the npn transistor).

When the gate electrode voltage is removed (e.g., the gate metal is shorted to the metal cathode electrode 20), the effective width of the npn transistor base is again widened to reduce the gain of the npn transistor. Since the product of the gains of the npn and pnp transistors is now less than one, there is no regenerative action, and the device turns off.

However, current may flow for a brief time after the gate electrode 12 is biased off due to residual electrons in the p-well 14. The improvement, described below, over the device of FIG. 1 quickly removes such electrons to accelerate the termination of current flow.

A low dopant concentration n-type layer 52 is formed by implanting n-type dopants through the silicon surface. The depth and dopant concentration are not critical to performance, and the concentration may be between that of the n+ regions 18 and the n-epi layer 32.

A p+ region 54 is formed by implanting p-type dopants through the surface so that the p+ region 54 extends between the cathode electrode 20 and the n-type layer 52. The n-type layer 52 is needed to prevent the p+ region 54 from contacting the p-well 14. So the n-type layer 52 just has to be formed slightly below the p+ region 54. The n-type layer 52 extends the npn transistor emitter further into the p-well 14 so it is important that the n-type layer 52 does not substantially increase the gain of the npn transistor in the off state so as to keep the product of the gains of the npn and pnp transistors less than one when the gate electrode 12 is biased off.

Immediately after the gate electrode voltage is removed, and the conduction is stopped, there will still be residual electrons in the p-well 14. Although the electrons will eventually be removed or will recombine with holes, either behavior delays the termination of current flow.

By adding the p+ region 54 and n-type layer 52, the p+ region 54 serves as a reservoir of holes that are available to combine with the conduction electrons. As a result, the p+ region 54 provides holes that recombine with the residual electrons to quickly stop the flow of current after the gate is biased off.

Figure 5:
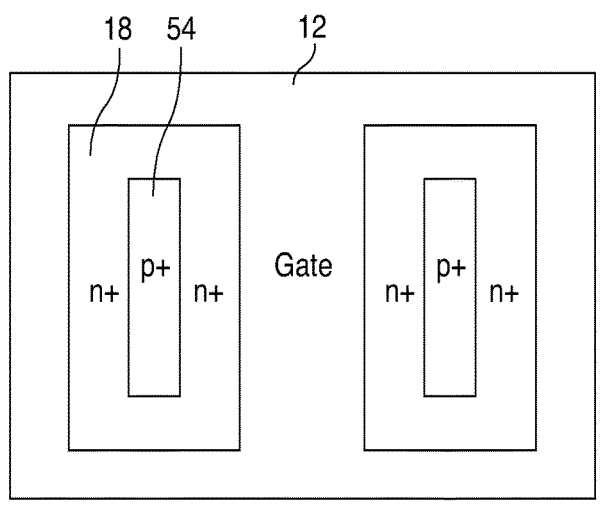
FIG. 5 is a top down view of a "compressed" vertical gate area and the surface semiconductor material on both sides of the gate electrode. The cells may be in strips (shown in FIG. 5) or have other shapes, such as squares, hexagons, etc. Actual cells would be much longer than shown relative to the width dimension.

FIG. 5 is a top down view of a vertical gate electrode 12 and the silicon regions on both sides of the gate electrode 12. The cells are formed as strips. In an actual device, the strips would be much longer relative to the widths shown in FIG. 5.

Simulations have shown that the device of FIG. 4 turns off faster than a device without the p+ region 54. Such simulations will be described in more detail later.

Figure 6:
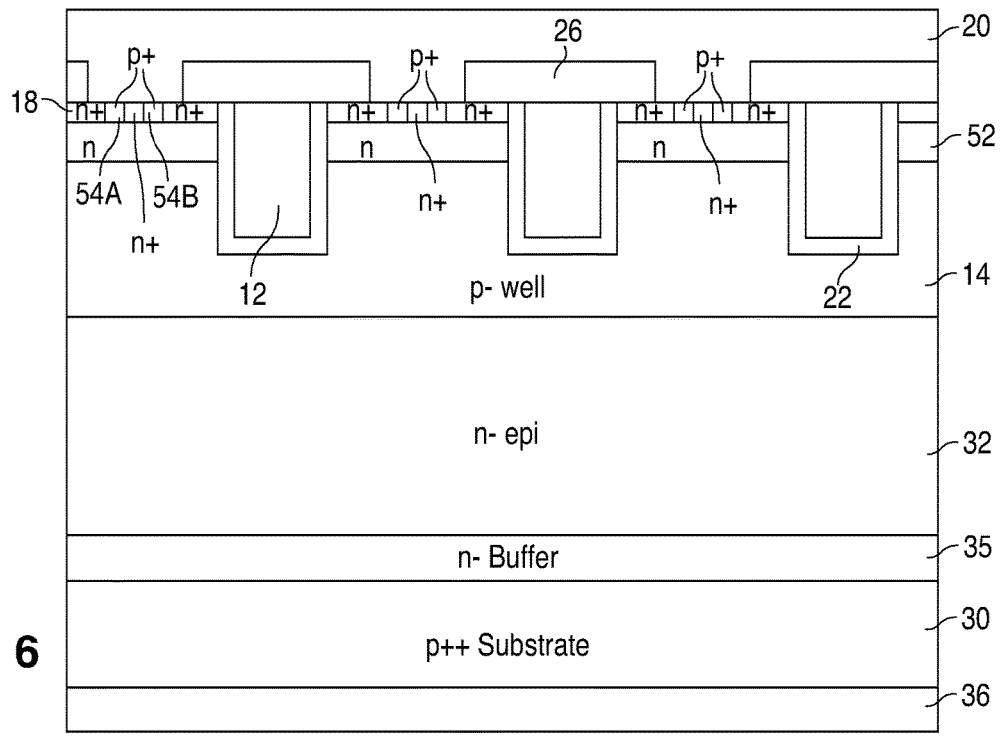
FIG. 6 is a cross-sectional view of a variation of the device of FIG. 4 where two top p+ regions are distributed between the n+ regions.

The same advantages in turn-off speed can be achieve with two or more p+ regions distributed between each gate electrode 12, as shown in FIG. 6. The p+ regions in FIG. 6 are labeled 54A and 54B since they are similar to the p+ region 54 in FIG. 4.

The p+ regions 54 reduce the n+ region 18 area and may slightly reduce the emitter area of the npn transistor, reducing its efficiency. In one embodiment, the p+ regions 54 are not included in every cell, but are distributed around the array of cells. The same function is achieved.

Figure 7:
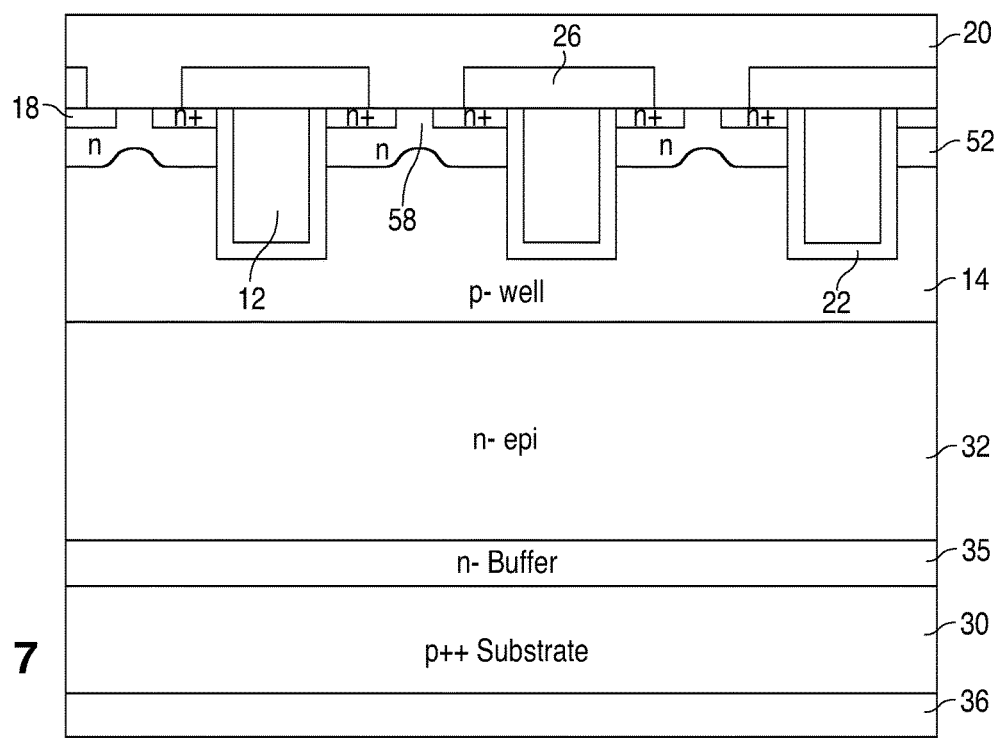
FIG. 7 is a cross-sectional view of another variation of the device of FIG. 4 where a gap is formed between the n+ regions to cause the cathode metal to be directly connected to the n-type layer.

FIG. 7 illustrates an embodiment that does not require the presence of a p+ region. Instead, the lightly doped n-type regions 52 are formed only around each n+ region 18. The implant mask for forming the n+ regions 18 is also used for the implantation for the n-type regions. Adjacent n-type regions 52 intersect by lateral diffusion, but the n-type dopant concentration in this overlapping area 58, and hence the conduction electron concentration, is relatively low. Thus, the n-type region 52 is shown thinner between the n+ regions 18. A lower conduction electron concentration means that the equilibrium hole concentration must be higher in this region than in nearby regions. These additional holes are available to recombine with conduction electrons when the gate voltage is reduced below the threshold voltage of the IGTO device.

Figure 8:
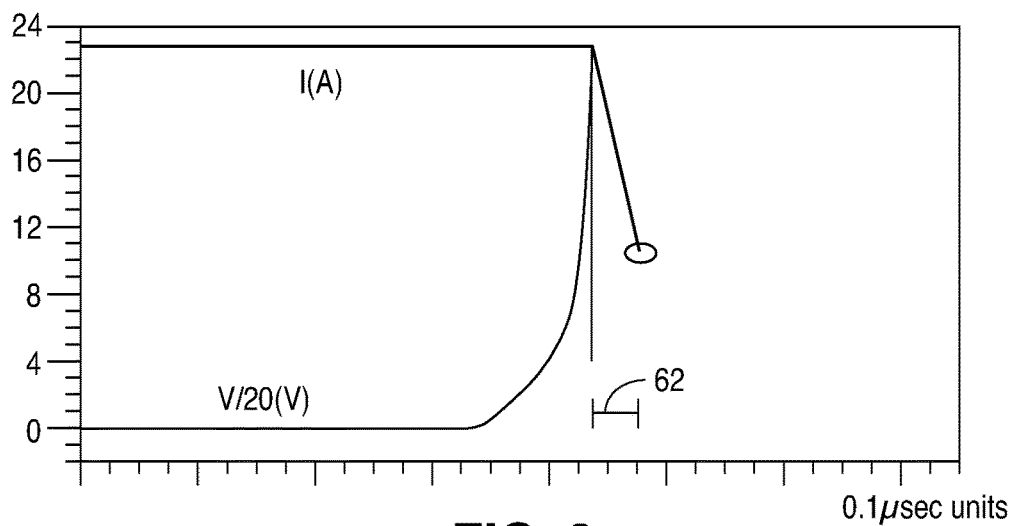
FIG. 8 is a graph based on simulations showing the turn-off time of a device similar to FIG. 1, which does not use the p+ region of FIG. 4 or 5 or the gap of FIG. 7. The current and the cathode-anode voltage are shown vs. the turn-off time (in units of tenths of microseconds).
Figure 9:
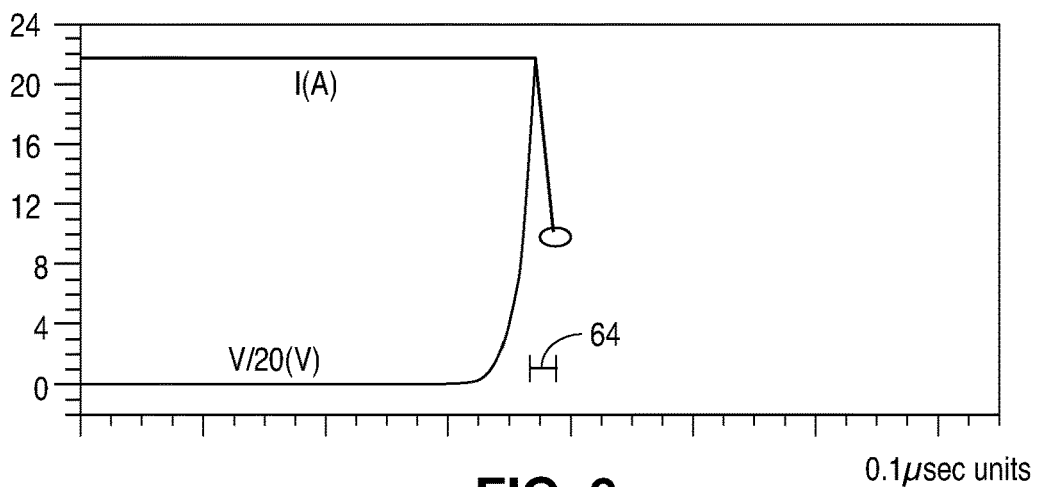
FIG. 9 is a graph based on simulations showing the turn-off time of a device similar to FIG. 4, which includes the p+ region 54. The current and the cathode-anode voltage are shown vs. the turn-off time.
Figure 10:
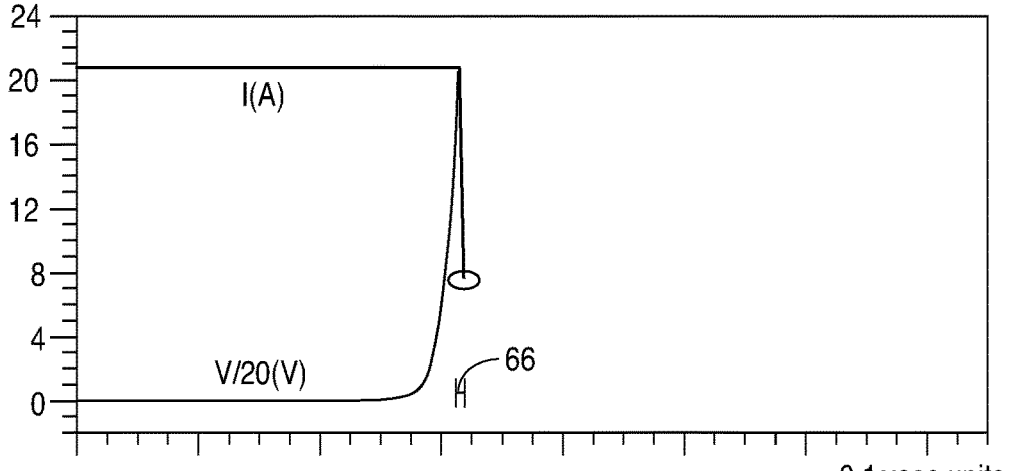
FIG. 10 is a graph based on simulations showing the turn-off time of a device similar to FIG. 4, but with a p+ region 54 that is larger than the p+ region 54 used in the simulation of FIG. 9, showing a further improvement in turn-off time. The current and the cathode-anode voltage are shown vs. the turn-off time.

FIGS. 8-10 are graphs representing simulation results during turn-off of the devices. The units of the x-axis are in tenths of microseconds. The units along the y-axis are either Amperes or voltage, depending on if current I or voltage V is being measured. The voltage is shown in the graph as 1/20 of the simulated voltage, where the full voltage across the device in its off state is about 400V and the full current in the on state is about 22 A. When the devices are turned off, the anode-to-cathode current rapidly goes from a high value to a low value, and the anode-to-cathode voltage rapidly goes from a low value to a high value. Turn-off time, for purposes of the simulation values, is considered to be at the time when the current is about half of the full on-current.

FIG. 8 is a simulation of an IGTO device without the added p+ region 54. Note the time between the current beginning to drop (due to the removal of the gate electrode voltage) and the 50% current level is shown by the time interval 62 (about 0.25 microseconds).

FIG. 9 is a simulation of the device of FIG. 4 with the added p+ region 54. Note the time between the current beginning to drop (due to the removal of the gate electrode voltage) and the 50% current level is shown by the time interval 64 (about 0.1 microseconds).

FIG. 10 is a simulation of the device of FIG. 4 with a p+ region 54 that is larger than the p+ region 54 used in the simulation of FIG. 9. The turn-off time has decreased compared to the simulation of FIG. 9. Note the time between the current beginning to drop (due to the removal of the gate electrode voltage) and the 50% current level is shown by the time interval 66 (about 0.05 microseconds).

Therefore, simulations have shown the embodiments of FIGS. 4-7 to be an improvement over the prior art designs regarding the turn-off times.

The inventive technique can be applied to many other types of IGTO devices that use a vertical gate electrode to control the conduction of vertical bipolar transistors.

The conductivity types of all semiconductor layers and regions may be opposite those described.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off (IGTO) device formed as a die comprising:
   a first semiconductor layer of a first conductivity type;
   a second semiconductor layer of a second conductivity type overlying the first semiconductor layer;
   a third semiconductor layer of the first conductivity type overlying at least a portion of the second semiconductor layer;
   an array of cells comprising a plurality of insulated gate electrodes within trenches formed within the third semiconductor layer but not extending down to the second semiconductor layer;
   at least some of the cells comprising:
      a first semiconductor region of the second conductivity type within the third semiconductor layer and between adjacent gate electrodes, the first semiconductor region having a first dopant concentration, wherein there is a gap in the first semiconductor region;
      a second semiconductor region of the second conductivity type within the third semiconductor layer and between the adjacent gate electrodes, the second semiconductor region being deeper than the first semiconductor region and having a second dopant concentration less than the first dopant concentration;
      the first semiconductor layer, the second semiconductor layer, the third semiconductor layer, the first semiconductor region, and the second semiconductor region forming vertical npn and pnp bipolar transistors, wherein biasing the gate electrodes above a threshold voltage causes the npn and pnp transistors to vertically conduct;
      a first electrode overlying and in contact with the first semiconductor region and a top surface of the gap in the first semiconductor region; and
      a second electrode in contact with the first semiconductor layer,
      wherein the gap is of the first conductivity type and forms a third semiconductor region of the first conductivity type separated from the third semiconductor layer by the second semiconductor region.

2. An insulated gate turn-off (IGTO) device formed as a die comprising:
   a first semiconductor layer of a first conductivity type;
   a second semiconductor layer of a second conductivity type overlying the first semiconductor layer;
   a third semiconductor layer of the first conductivity type overlying at least a portion of the second semiconductor layer;
   an array of cells comprising a plurality of insulated gate electrodes within trenches formed at least within the third semiconductor layer;
   at least some of the cells comprising:
      a first semiconductor region of the second conductivity type within the third semiconductor layer and between adjacent gate electrodes, the first semiconductor region having a first dopant concentration, wherein there is a gap in the first semiconductor region;
      a second semiconductor region of the second conductivity type within the third semiconductor layer and between the adjacent gate electrodes, the second semiconductor region being deeper than the first semiconductor region and having a second dopant concentration less than the first dopant concentration;
      the first semiconductor layer, the second semiconductor layer, the third semiconductor layer, the first semiconductor region, and the second semiconductor region forming vertical npn and pnp bipolar transistors, wherein biasing the gate electrodes above a threshold voltage causes the npn and pnp transistors to vertically conduct;
      a first electrode overlying and in contact with the first semiconductor region and a top surface of the gap in the first semiconductor region; and
      a second electrode in contact with the first semiconductor layer,
      wherein the gap is of the second conductivity type and is part of the second semiconductor region.

3. The device of claim 1 where there are a plurality of third semiconductor regions between adjacent gate electrodes.

4. The device of claim 1 wherein the first conductivity type is a p-type, and the second conductivity type is an n-type.

5. The device of claim 1 wherein the first conductivity type is an n-type, and the second conductivity type is a p-type.

6. The device of claim 1 wherein the first semiconductor layer is a growth substrate.

7. The device of claim 1 wherein the third semiconductor layer is formed as a well.

8. The device of claim 1 wherein the first semiconductor region is formed as an epitaxial layer.

9. The device of claim 1 wherein the first electrode is a cathode electrode and the second electrode is an anode electrode.

10. The device of claim 1 wherein the gap is only within a subset of the cells.

11. The device of claim 1 wherein the second semiconductor region extends completely between adjacent gate electrodes.

* * * * *